(12) United States Patent
Pendurkar

(10) Patent No.: US 6,681,357 B2
(45) Date of Patent: Jan. 20, 2004

(54) MISR SIMULATION TOOL FOR MEMORY BIST APPLICATION

(75) Inventor: Rajesh Pendurkar, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 378 days.

(21) Appl. No.: 09/871,290

(22) Filed: May 31, 2001

(65) Prior Publication Data

US 2002/0184586 A1 Dec. 5, 2002

(51) Int. Cl.[7] .................. G01R 31/28; G06F 11/00
(52) U.S. Cl. ........................ 714/732; 714/741
(58) Field of Search .................. 714/732, 741

(56) References Cited

U.S. PATENT DOCUMENTS 4,918,378 A * 4/1990 Katircioglu et al. ........ 365/201
5,617,531 A * 4/1997 Crouch et al. ................ 714/30

OTHER PUBLICATIONS

Khadour, F.; Xiaoling Sun; A fast signature simulation technique for PPSFP simulators, 1999 IEEE Canadian Conference on Electrical and Computer Engineering, vol.: 1, May 9–12, 1999, pp.: 543–548.*

Khadour, F.; Xiaoling Sun; Fast signature simulation for PPSFP simulators, International Symposium on Defect and Fault Tolerance in VLSI Systems, Nov. 1–3, 1999, pp.: 181–189.*

Broseghini, J.; Lenhert, D.H.; An ALU–based programmable MISR/pseudorandom generator for a MC68HC11 family self–test, Proceedings, International Test Conference, Oct. 17–21, 1993, pp.: 349–358.*

Franklin, M.; Fast computation of C–MISR signatures, Proceedings of the Fourth Asian Test Symposium, Nov. 23–24, 1995, pp.: 293–297.*

* cited by examiner

Primary Examiner—Phung M. Chung
Assistant Examiner—Joseph D. Torres
(74) Attorney, Agent, or Firm—Rosenthal & Osha L.L.P.

(57) ABSTRACT

A method and tool for simulating a multiple input signature register for a memory test application is provided. Further, a method and tool for signature simulation based on a configuration, type, and/or size of a memory structure is provided. Further, a method and tool for multiple input signature register simulation for a memory built-in self test application is provided.

26 Claims, 4 Drawing Sheets

MISR SIMULATION TOOL FOR MEMORY BIST APPLICATION

BACKGROUND OF INVENTION

In order to make computer system testing accurate and effective, the design of a computer system often includes test functionality within one or more devices of the computer system itself. One type of such a test design involves a built-in self test ("BIST") technique. Typically, a BIST technique allows for device testing to occur through built-in hardware features. An advantage of such a BIST technique is that a particular device can indicate directly and quickly its failure status during testing.

FIG. 1 shows a block diagram of a typical prior art BIST design (10). The BIST design (10) includes a test controller (also known in the art as "BIST controller") (12) which performs managerial functions such as running a particular test, determining when the test is done, and checking the responses, i.e., the outputs, generated by that particular test. The test controller (12) is connected to a multiplexor stage (14) to which the test controller (12) indicates whether to pass regular data input values to an input of a circuit being tested (16) (also known in the art as "circuit under test") or whether to pass values generated by a test pattern generator (18) the circuit being tested (16).

The test pattern generator (18), under the control of the test controller (12), is typically capable of generating multiple test pattern values to the circuit being tested (16) depending on the various types of tests that can be conducted for the BIST design (10). The circuit being tested (16) has both regular logic (20) and test logic (also known in the art as "scan logic") (22), where the regular logic (20) is used for regular, i.e., normal, data operations and the test logic (22) is used to test the functionality of the regular logic (20) based on values provided to it by the test pattern generator (18).

The circuit being tested (16) generates regular outputs and test outputs, where the test outputs are fed into a output response analysis stage (24). The output response analysis stage (24) is typically used to monitor the test outputs and compare the test outputs with predicted, i.e., expected, output values to determine whether the circuit is functioning properly. The output response analysis stage (24) is connected to the test controller (12) so that the test controller (12) can both manage the output response analysis stage (24) and receive signals from the output response analysis stage (24) indicating to it whether or not a particular test has failed.

When implementing circuitry for a BIST design, such as the one described above with reference to FIG. 1, consideration must be given to how test responses are handled in the output response analysis stage. Generally, it is not feasible to store in a circuit all expected test responses, and thus, a typical solution is to reduce a circuit's test responses to relatively short sequences. The process of reducing test responses to relatively short sequences is called "data compaction" and the resulting shortened sequences are called "signatures." After a signature is created, the signature is compared to a "golden" signature, where the golden signature represents the expected signature for a particular test.

In order to generate a signature of a circuit's test responses, a multiple input signature register ("MISR") is commonly used. A MISR inputs test response values from a circuit being tested and compacts the test response values into a signature, which is then compared to the golden signature to determine whether the circuit has a fault.

FIG. 2 shows a multiple input signature register (30) in a BIST design. Essentially, the MISR (30) inputs a vector of test response values in parallel from a circuit being tested, integrates those values with a value of a current state of the MISR (30), and leaves the result in the MISR (30) for integration with the next vector of test response values. If any single test response value from the circuit turns out to be inaccurate due to a circuit fault, the state of the MISR (30) is adversely affected such that a final result—the "signature"—will not be the same as an expected result.

Specifically, the MISR (30) shown in FIG. 2 includes a sequence of n exclusive-OR gates (32, 34, 36) that each output to a corresponding flip-flop (38, 40, 42), where n equals the number of flip-flops in the MISR (30). Further, each exclusive-OR gate (32, 34, 36) has an input connected to a corresponding test response value from a circuit being tested (44).

A characteristic polynomial of a MISR indicates which flip-flops in the MISR are subject to feedback. Feedback is often created in a MISR to increase the number of states that a MISR can transition through. For instance, in FIG. 2, $FF_1$ and $FF_0$ (40, 42) could be subject to feedback by connecting a third input of the corresponding exclusive-OR gates (34, 36) to an output of $FF_0$ (42) (shown by dotted lines in FIG. 2). In this case, the characteristic polynomial for the MISR (30) would be $x^n+x^2+x+1$. Moreover, such feedback connections are often referred to in the art as "taps."

Because a MISR should be capable of transitioning through a maximum number of states, the MISR is physically structured according to its particular n value. The characteristic polynomial of a MISR that generates the maximum length state sequence is called a "primitive polynomial." For example, for a MISR with n=20, the maximum state sequence occurs when its characteristic polynomial is $x^n+x^3+1$, and thus, the primitive polynomial of the MISR is $x^n+x^3+1$.

In order to generate a golden signature to compare with an actual resulting signature of the MISR, a signature simulation tool (also known as "MISR simulation tool") is often used during a BIST application. The signature simulation tool is typically implemented in software, and during a test, the signature simulation tool forms its own MISR in software, determines the states of the MISR based on the circuit configuration being tested, and generates a golden signature to determine whether the signature generated by the MISR in hardware is correct.

However, due to the various sizes, types, and complex configurations of memory circuits, e.g., memory arrays, signature simulation tools are prone to inaccuracies. In other words, a signature simulation tool that is effective for a circuit such as a flip-flop is generally not effective for a circuit such as a memory array.

SUMMARY OF INVENTION

According to one aspect, a method for generating a signature for a memory test application comprises opening a configuration file, reading information from the configuration file, selectively creating structures to store data for the memory test application, running a test algorithm on the selectively created structures according to the information read from the configuration file, and generating a signature dependent on a result of the test algorithm.

According to another aspect, a configuration file includes an address size, a data bus width, a data background, a size of a signature register, a primitive polynomial of the signature register, a number of memory banks, an initial value of the signature register, and/or a type of the a test algorithm to be used for a memory test application.

According to another aspect, a method for simulation a signature register for a memory test application comprises opening a configuration file, reading information from the configuration file, selectively creating structures to store data for the memory test application, wherein selectively creating structures is dependent on the information read from the configuration file, running a test algorithm on the selectively created structures according to the information read from the configuration file, and generating a signature in the signature register dependent on a result of the test algorithm.

According to another aspect, a software tool that generates a signature for a test of a memory device in a computer system comprises a processor, a memory, and software instructions residing on memory executable on the processor for performing a series of operations to generate the signature based on information provided in a configuration file, where the configuration file comprises at least one selected from the group consisting an address size, a data bus width, a data background, a size of a signature register, a primitive polynomial of the signature register, a number of memory banks, an initial value of the signature register, and a type of the test algorithm to be used for the memory test application.

Other aspects and advantages of the invention will be apparent from the following description and the appended claims.

DETAILED DESCRIPTION

The present invention relates to a method and tool for simulating a test of a device in a computer system. The present invention also relates to a method and tool for generating a golden signature during a test of a device in a computer system. The present invention further relates to a method and tool simulating a multiple input signature register for a memory test application.

More particularly, the present invention simulates the behavior of a MISR for a memory test while considering various factors including, but not limited to, a data background and data size of the memory, an addressing scheme of the memory, a read mechanism by which data in the memory is read, a configuration of the memory, a size of an actual MISR used in the memory test, a primitive polynomial of the actual MISR, an initial value of the actual MISR, and a memory test algorithm by which the memory is tested. By considering these various factors, the present invention allows for increased flexibility and accuracy in signature simulation.

Figure 1:
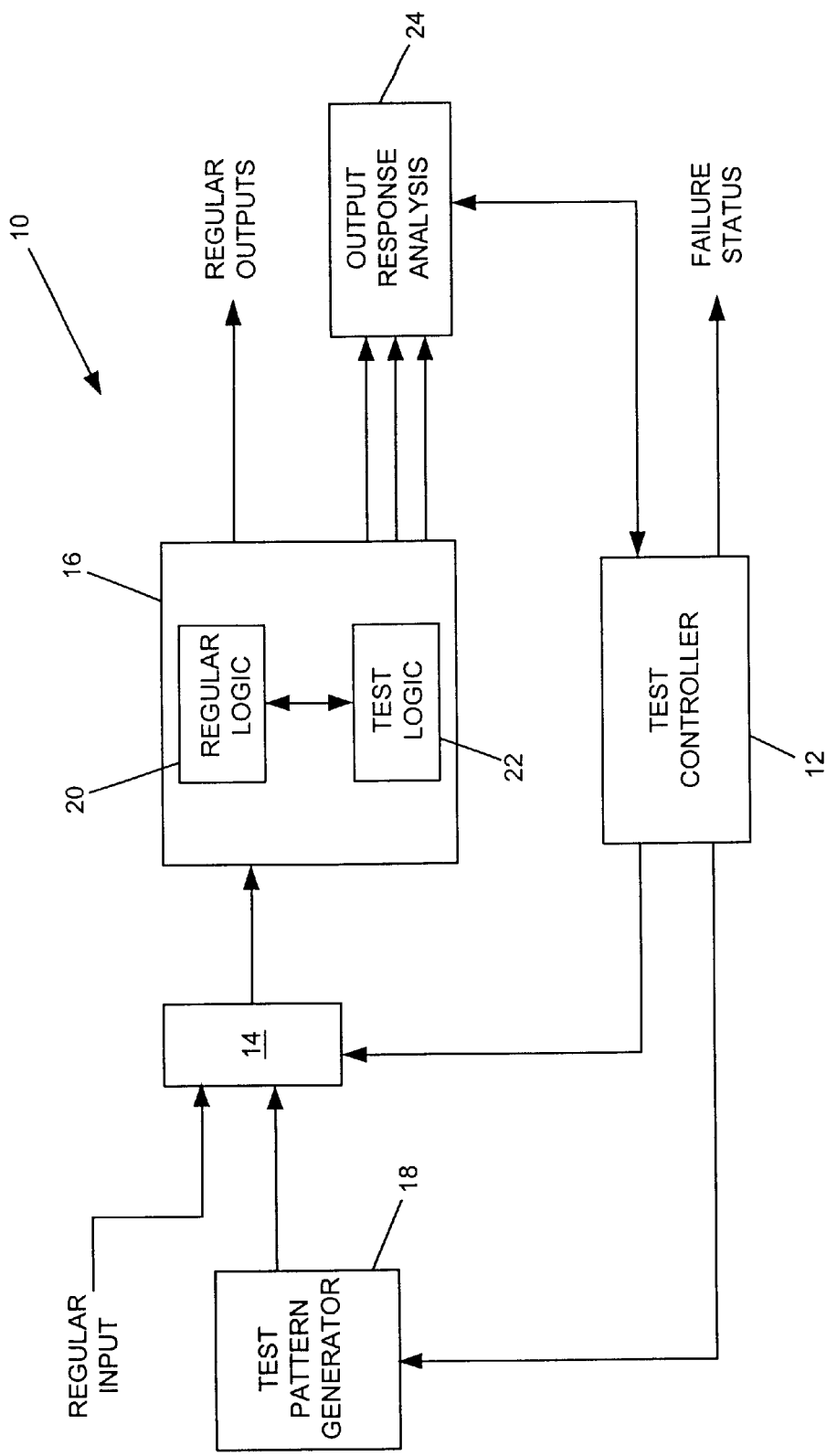
FIG. 1 shows a prior art BIST design.
Figure 2:
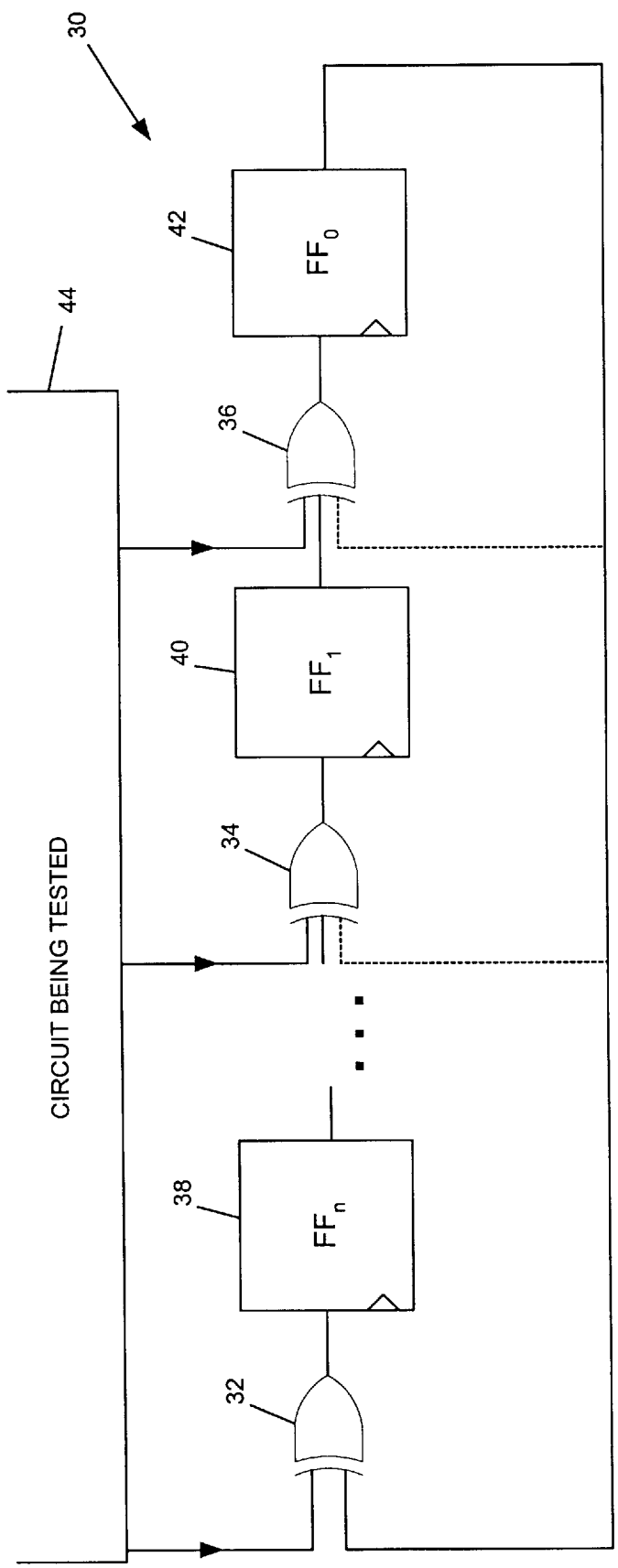
FIG. 2 shows a multiple input signature register.
Figure 3:
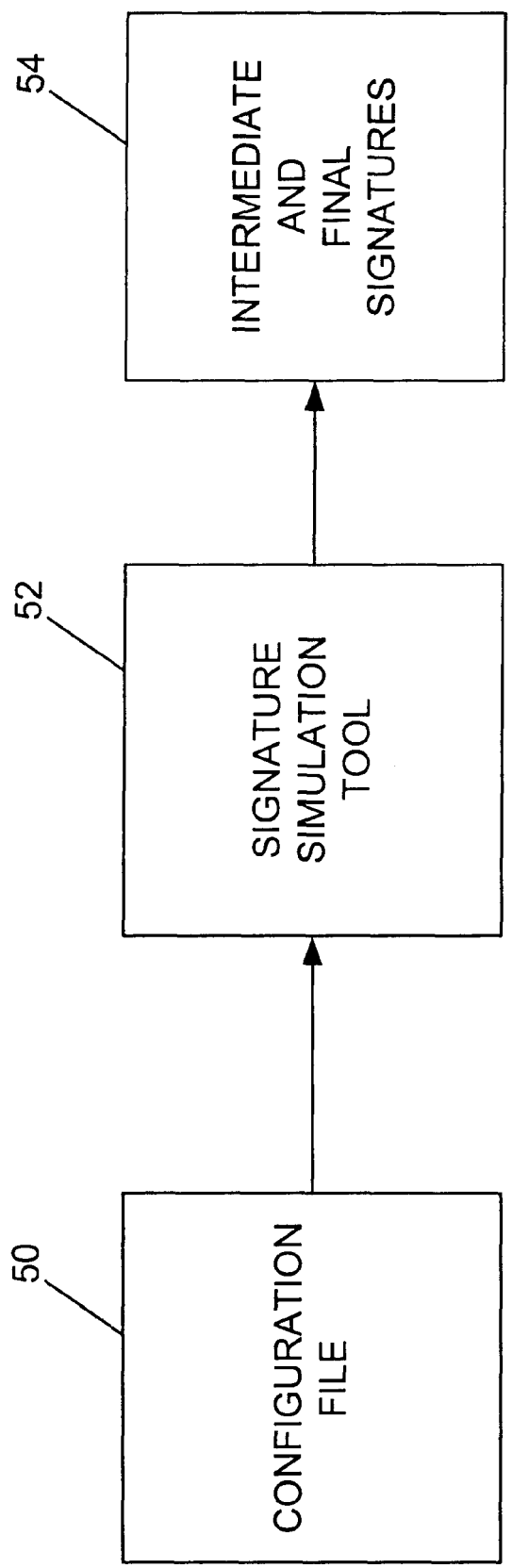
FIG. 3 shows a block diagram in accordance with an embodiment of the present invention.

FIG. 3 shows an exemplary block diagram in accordance with an embodiment of the present invention. A configuration file (50) includes user specified information such as an address size of the memory, a width of a data bus used by the memory, data in the memory (also referred to as "data background"), an n value of an actual MISR used in the memory test, a number of taps that exist in the actual MISR, a number of memory banks in the memory, an initial value of the actual MISR, and a type of test algorithm by which the memory is tested, e.g., a $6n$ march test algorithm. The information in the configuration file (50) is inputted to a signature simulation tool (52), which, in turn, generates intermediate and final signatures (54) for a particular memory test. These intermediate and final signatures are considered to be the expected signatures, i.e., the golden signatures, and they are compared to the actual signatures generated by the memory test.

Figure 4:
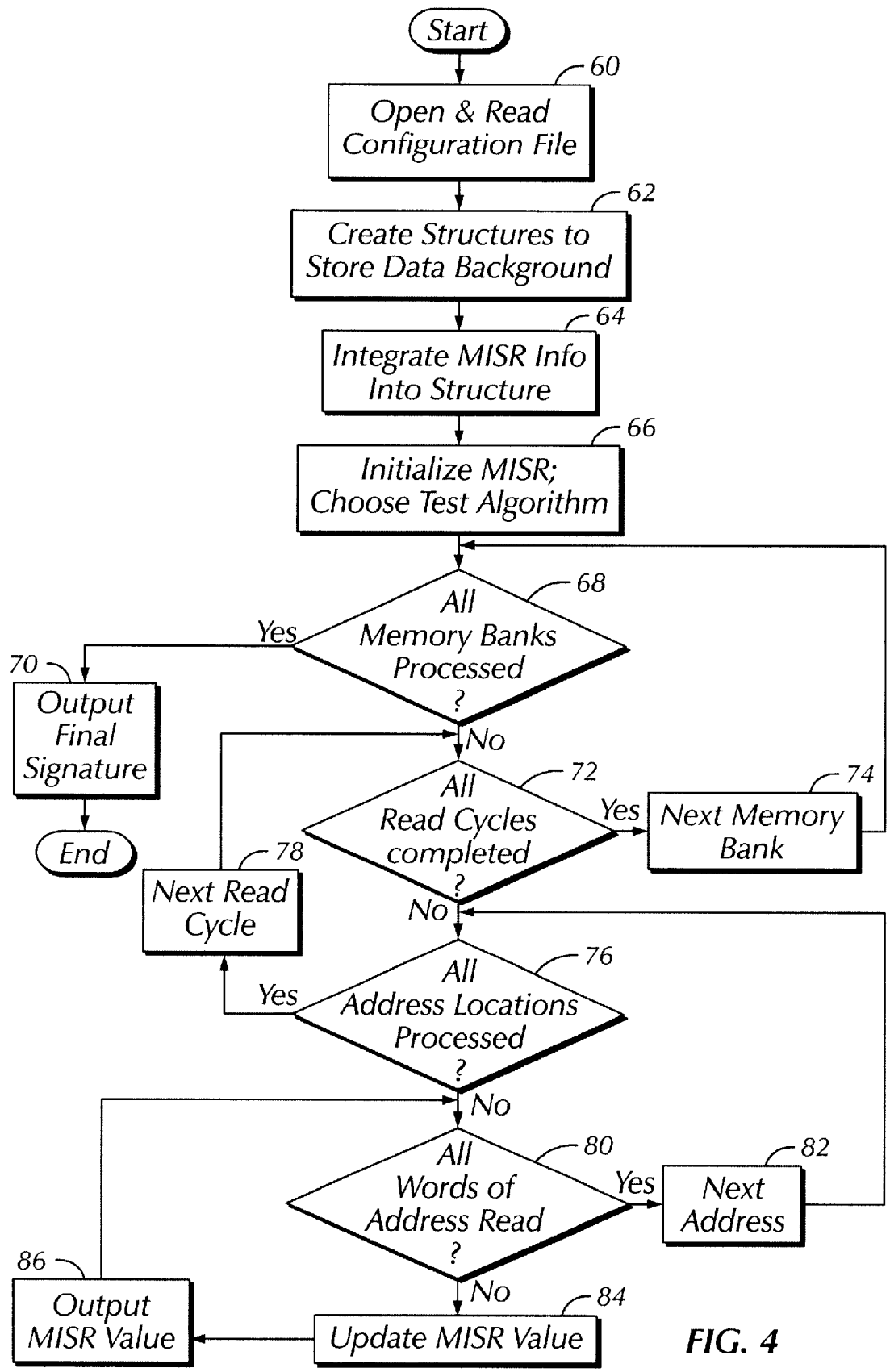
FIG. 4 shows a flow process in accordance with an embodiment of the present invention.

FIG. 4 shows an exemplary flow process of a signature simulation tool in accordance with an embodiment of the present invention. The flow process begins as the signature simulation tool opens and reads a configuration file (step 60). After opening and reading the data from the configuration file (step 60), the signature simulation tool creates structures in software to store the data background (step 62) it read from the configuration file (step 60). Next, the signature simulation tool integrates the MISR size and configuration into the structures created for the data background (step 64). This is done to replicate the actual MISR's connections to test response outputs.

Thereafter, the signature simulation tool initializes its MISR (step 66) according to the data it read from the configuration file (step 60). At this time, the signature simulation tool also chooses a test algorithm (step 66) according to the data it read from the configuration file (step 60).

For purposes of the description with reference to FIG. 4, a $6n$ march test algorithm will be followed. A $6n$ march test algorithm is an algorithm used in writing and reading an array of N data in six-stage operations. Specifically, a $6n$ march test algorithm is performed by writing data from a lowest address to a highest address, reading the data and writing a complement of the data from the lowest address to the highest address, and then reading the complement of the data, writing the data, and reading the data from the highest address to the lowest address. Those skilled in the art will appreciate that for the purposes of the present invention, the signature simulation tool obtains intermediate or final MISR signatures for every read cycle in the $6n$ mart test algorithm. Further, those skilled in the art will appreciate that in other embodiments, the present invention may follow alternative test algorithms based on test specifications.

Once the structures for the data background and the MISR are readied, the signature simulation tool begins to simulate intermediate and final MISR values. First, it is determined whether all banks in the memory have been tested (step 68). If all the banks in the memory have been tested, then the signature in the simulated MISR is generated to a file (step 70), where the signature is the golden signature for the memory test. However, if all the banks in the memory have not been tested, the signature simulation tool determines whether all read cycles for the $6n$ march test algorithm have been completed (step 72) for a current memory bank in the flow process. If all the read cycles have been completed, then this indicates that the intermediate MISR signatures for the current memory bank have been obtained. In this case, the signature simulation tool increments the current memory bank number in the flow process (step 74) and goes back to determining whether all the memory banks have been tested (step 68).

However, in the event that all the read cycles for the current memory bank have not been completed, the signature simulation tool determines whether all the address locations for a current read cycle in the flow process have been processed (step 76). If all the address locations for the current read cycle have been processed (step 76), then this indicates that the current read cycle has been completed. In this case, the signature simulation tool goes to the next read cycle (step 78) and determines whether all the read cycles have been completed (step 72).

However, if all the address locations for the current read cycle have not been processed, the signature simulation tool determines whether all the words of a current address location in the flow process have been read (step 80). If all the words for the current address location have been read, then this indicates that the current address location has been processed. In this case, the signature simulation tool increments the address location in the flow process (step 82) and determines whether all the address locations have been completed (step 76).

However, if all the words for the current address location have not been read, the signature simulation tool updates the MISR value (step 84) according to the primitive polynomial value of the MISR, outputs the updated MISR value to a file (step 86), and goes back to determine whether all the words for the current address location have been read (step 80).

Those skilled in the art will appreciate the flow process described in FIG. 4 may be applied to alternative test algorithms.

Advantages of the present invention may include one or more of the following. In some embodiments, a signature simulation tool may generate a golden signature for a memory circuit test application.

In some embodiments, because a signature simulation tool considers various factors of a memory circuit, the signature simulation tool may be used for accurate and effective simulation of a golden signature for a memory test application.

In some embodiments, a signature simulation tool has increased flexibility because it may simulate a multiple input signature register under various memory configurations and test algorithms.

In some embodiments, because a signature simulation tool operates dependent on specified user options in a configuration file, the signature simulation tool, under user designations, may be used for various memory configurations and test algorithms.

In some embodiments, because a signature simulation tool generates values of multiple states of a multiple input signature register during a test, the signature simulation tool may be used for hardware debugging in addition to being used for final signature verification.

In some embodiments, because a signature simulation tool generates values of multiple states of a multiple input signature register during a test, the signature simulation tool may be used to improve fault coverage when a particular fault is mapped to a particular multiple input signature register value.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for generating a signature for a memory test application, comprising:

opening a configuration file comprising information specific to a configuration of a memory being tested;

reading information from the configuration file;

selectively creating structures to store data for the memory test application, wherein selectively creating structures is dependent on the information read from the configuration file;

running a test algorithm on the selectively created structures according to the information read from the configuration file; and generating a signature dependent on a result of the test algorithm.

2. The method of claim 1, wherein the configuration file comprises at least one selected from the group consisting an address size, a data bus width, a data background, a size of a signature register, a primitive polynomial of the signature register, a number of memory banks, an initial value of the signature register, and a type of the test algorithm to be used for the memory test application.

3. The method of claim 1, further comprising:

determining whether a memory bank has been processed according to the test algorithm; and generating a signature if the memory bank has been processed.

4. The method of claim 3, further comprising:

determining whether a read cycle for the memory bank has been completed if the memory bank has not been processed; and selecting a next memory bank if the read cycle for the memory bank has been completed.

5. The method of claim 4, further comprising:

determining whether an address location for the read cycle has been processed if the read cycle for the memory bank has not been processed; and selecting a next read cycle if the address location for the read cycle has been processed.

6. The method of claim 5, further comprising:

determining whether a word of the address location has been read if the address location for the read cycle has not been processed; and selecting a next address location if the word of the address location has been read.

7. The method of claim 6, further comprising:

updating the signature if the word of the address location has not been read;

generating the signature to an output file; and determining whether a next word of the address location has been read.

8. The method of claim 1, wherein the signature is an intermediate signature.

9. The method of claim 1, wherein the signature is a golden signature.

10. The method of claim 1, where the signature is compared to an actual signature generated by the memory test application.

11. The method of claim 1, wherein the memory test application is a built-in self test application.

12. A software tool that generates a signature for a test of a memory device in a computer system, comprising:

a processor;

a memory; and software instructions residing on memory executable on the processor for performing a series of operations to generate the signature based on a configuration file comprising information specific to a configuration of a memory being tested, wherein the configuration file comprises at least one selected from the group consisting an address size, a data bus width, a data background, a size of a signature register, a primitive polynomial of the signature register, a number of memory banks, an initial value of the signature register, and a type of the test algorithm to be used for the memory test application.

13. The software tool of claim 12, further comprising:

a first portion that determines whether a bank in memory has been processed according to a specified test algorithm;

a second portion that determines whether a read cycle has completed;

a third portion that determines whether an address location of the read cycle has been processed;

a fourth portion that determines whether a word in the address location has been read; and a last portion that selectively updates a value of the signature.

14. The software tool of claim 12, wherein the information is in the configuration file is provided by an user.

15. The software tool of claim 12, wherein the signature is a golden signature.

16. The software tool of claim 12, wherein the test for the memory device is a built-in self test.

17. A method for simulation a signature register for a memory test application, comprising:

opening a configuration file comprising information specific to a configuration of a memory being tested;

reading information from the configuration file;

selectively creating structures to store data for the memory test application, wherein selectively creating structures is dependent on the information read from the configuration file;

running a test algorithm on the selectively created structures according to the information read from the configuration file; and generating a signature in the signature register dependent on a result of the test algorithm.

18. The method of claim 17, wherein the configuration file comprises at least one selected from the group consisting an address size, a data bus width, a data background, a size of the signature register, a primitive polynomial of the signature register, a number of memory banks, an initial value of the signature register, and a type of the test algorithm to be used for the memory test application.

19. The method of claim 17, further comprising:

determining whether a memory bank has been processed according to the test algorithm;

selectively updating the signature in the signature register if the memory bank has been processed; and outputting the signature.

20. The method of claim 19, further comprising:

determining whether a read cycle for the memory bank has been completed if the memory bank has not been processed; and selecting a next memory bank if the read cycle for the memory bank has been completed.

21. The method of claim 20, further comprising:

determining whether an address location for the read cycle has been processed if the read cycle for the memory bank has not been processed; and selecting a next read cycle if the address location for the read cycle has been processed.

22. The method of claim 21, further comprising:

determining whether a word of the address location has been read if the address location for the read cycle has not been processed; and selecting a next address location if the word of the address location has been read.

23. The method of claim 22, further comprising:

updating the signature in the signature register if the word of the address location has not been read;

outputting the signature to the file; and determining whether a next word of the address location has been read.

24. The method of claim 17, wherein the memory test application is a built-in self test application.

25. The method of claim 17, wherein the signature is a golden signature.

26. The method of claim 17, wherein the signature register is a multiple input signature register.

* * * * *